US012813279B2

(12) United States Patent
Lee et al.

(10) Patent No.: US 12,813,279 B2
(45) Date of Patent: Nov. 24, 2026

(54) SEMICONDUCTOR PACKAGE

(71) Applicant: SAMSUNG ELECTRONICS CO., LTD., Suwon-si (KR)

(72) Inventors: Shlege Lee, Suwon-si (KR); Hyunggil Baek, Suwon-si (KR); Minwoo Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 418 days.

(21) Appl. No.: 18/614,285

(22) Filed: Mar. 22, 2024

(65) Prior Publication Data

US 2024/0321775 A1 Sep. 26, 2024

(30) Foreign Application Priority Data

Mar. 24, 2023 (KR) ........................ 10-2023-0039248
Jun. 1, 2023 (KR) ........................ 10-2023-0071014

(51) Int. Cl.

*H01L 23/00* (2006.01)
*H10B 80/00* (2023.01)
*H10W 42/00* (2026.01)
*H10W 44/00* (2026.01)
*H10W 74/10* (2026.01)

(Continued)

(52) U.S. Cl.

CPC .......... *H10W 42/121* (2026.01); *H10B 80/00* (2023.02); *H10W 44/601* (2026.01); *H10W 74/114* (2026.01); *H10W 90/00* (2026.01); *H10W 90/701* (2026.01);

(Continued)

(58) Field of Classification Search

CPC ............. H10W 42/121; H10W 90/701; H10W 74/114; H10W 90/00; H10W 44/601; H10W 74/15; H10W 90/724; H10W 90/734; H10B 80/00

See application file for complete search history.

(56) References Cited

U.S. PATENT DOCUMENTS 9,454,055 B2 9/2016 Brown et al.
9,544,994 B2 1/2017 Kwon et al.

(Continued)

FOREIGN PATENT DOCUMENTS

EP 2 686 729 B1 5/2019
EP 3 186 835 B1 9/2020

*Primary Examiner* — Victor A Mandala
*Assistant Examiner* — Colleen E Snow
(74) *Attorney, Agent, or Firm* — Sughrue Mion, PLLC

(57) ABSTRACT

A semiconductor package comprises: a first package substrate; a semiconductor device mounted on a first surface of the first package substrate and connected to the first package substrate; a plurality of connection pads on a second surface of the first package substrate; a plurality of external connection terminals respectively disposed on one or more connection pads of the plurality of connection pads; a plurality of passive elements mounted on one or more connection pads of the plurality of connection pads in which the plurality of external connection terminals are not disposed; and a floating structure disposed between at least one passive element from the plurality of passive elements and at least one external connection terminal from the plurality of external connection terminals, spaced apart from the at least one passive element and the at least one external connection terminal, and disposed on the second surface of the first package substrate.

20 Claims, 10 Drawing Sheets

1A

(51) Int. Cl.
*H10W 90/00* (2026.01)
*H10W 74/15* (2026.01)

(52) U.S. Cl.
CPC .......... *H10W 74/15* (2026.01); *H10W 90/724* (2026.01); *H10W 90/734* (2026.01)

(56) References Cited

U.S. PATENT DOCUMENTS

| | | | |
|---|---|---|---|
| 9,842,818 B2 | 12/2017 | Li et al. | |
| 11,527,481 B2 | 12/2022 | Chee et al. | |
| 2021/0289629 A1 | 9/2021 | Lee et al. | |
| 2022/0336334 A1 | 10/2022 | Hsu et al. | |
| 2022/0359358 A1 | 11/2022 | Kim | |
| 2023/0044797 A1 | 2/2023 | Su et al. | |
| 2025/0118707 A1* | 4/2025 | Chen | H10P 72/74 |

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2023-0039248, filed on Mar. 24, 2023, and Korean Patent Application No. 10-2023-0071014, filed on Jun. 1, 2023 in the Korean Intellectual Property Office, the disclosures of which are incorporated by reference herein in their entireties.

BACKGROUND

1. Field

The embodiments relate to a semiconductor package.

2. Background of Related Art

In a semiconductor package, a land side capacitor (LSC) may be provided on the opposite side of a package substrate on which a semiconductor chip is mounted. A semiconductor package including a LSC may be mounted on a substrate. The semiconductor package may be mounted on the substrate, and an underfill layer may be interposed between the semiconductor package and the substrate. However, when a semiconductor chip mounted inside the semiconductor package is performing an operation and a temperature of the semiconductor package rises, a bulky underfill layer located near the LSC without solder balls thermally expands. Due to the thermal expansion of the underfill layer, cracks may occur in solder balls positioned around the LSC.

SUMMARY

The problem to be solved by the embodiments of the present disclosure is to provide a semiconductor package with improved reliability.

The problem to be solved by the embodiments of the present disclosure is not limited to the above-mentioned problems, and other problems not mentioned are clearly understood by those skilled in the art from the following description.

According to one or more embodiments, a semiconductor package comprises: a first package substrate; a semiconductor device mounted on a first surface of the first package substrate and electrically connected to the first package substrate; a plurality of connection pads on a second surface of the first package substrate; a plurality of external connection terminals respectively disposed on one or more connection pads of the plurality of connection pads; a plurality of passive elements mounted on one or more connection pads of the plurality of connection pads in which the plurality of external connection terminals are not disposed; and a floating structure disposed between at least one passive element from the plurality of passive elements and at least one external connection terminal from the plurality of external connection terminals, spaced apart from the at least one passive element and the at least one external connection terminal, and disposed on the second surface of the first package substrate, where the floating structure is insulated.

According to one or more embodiments, a semiconductor package comprises: a first redistribution structure; a semiconductor device mounted on first surface of the first redistribution structure and electrically connected to the first redistribution structure; a plurality of connection pads on a second surface of the first redistribution structure; a plurality of external connection terminals respectively disposed on at least one or more connection pads of the plurality of connection pads; and a plurality of passive elements mounted on one or more connection pads of the plurality of connection pads in which the plurality of external connection terminals are not disposed; an external substrate on which the first redistribution structure is mounted, and being electrically connected to at least one external connection terminal from the plurality of external connection terminals; a floating structure provided on the second surface of the first redistribution structure in a non-connection terminal area; and an underfill layer provided between the external substrate and the first redistribution structure, wherein the floating structure is insulated, and wherein the non-connection terminal area is defined as an area between the external substrate and the first redistribution structure where the plurality of external connection terminals are not disposed and the plurality passive elements are included.

According to one or more embodiments, a semiconductor package comprises: a first redistribution structure; a first semiconductor device mounted on a first surface of the first redistribution structure, electrically connected to the first redistribution structure, and including an application processor (AP); a plurality of connection pads on a second surface of the first redistribution structure; a plurality of external connection terminals respectively disposed on one or more connection pads of the plurality of connection pads; and a plurality of passive elements mounted on one or more connection pads of the plurality of connection pads in which the plurality of external connection terminals are not disposed; a floating structure disposed between at least one passive element from the plurality of passive elements and at least one external connection terminal from the plurality of external connection terminals, spaced apart from the at least one passive element and the at least one external connection terminal, and disposed on a second surface of the first redistribution structure; an external substrate on which the first redistribution structure is mounted and electrically connected to the external connection terminal; an underfill layer provided between the external substrate and the first redistribution structure; an encapsulant surrounding the first semiconductor device, on the first surface of the first redistribution structure; a second redistribution structure disposed on the encapsulant; a conductive post penetrating the encapsulant and electrically connecting the second redistribution structure and the first redistribution structure to each other; and a second semiconductor device mounted on a surface of the second redistribution structure and including a memory device, wherein the floating structure is insulated, wherein an adhesive layer is interposed between the floating structure and the second surface of the first redistribution structure so that the floating structure is attached by the adhesive layer, wherein the floating structure is between the first redistribution structure and the external substrate, in an overlapping region overlapping a shape of the first semiconductor device in a vertical direction, and the vertical direction is a direction perpendicular to the first and second surfaces of the first redistribution structure, and the floating structure is made of a material including silicon or polymer.

BRIEF DESCRIPTION OF DRAWINGS

Embodiments of the present disclosure will be more clearly understood from the following detailed description taken in conjunction with the accompanying drawings in which.

DETAILED DESCRIPTION OF EMBODIMENTS

Figure 1:
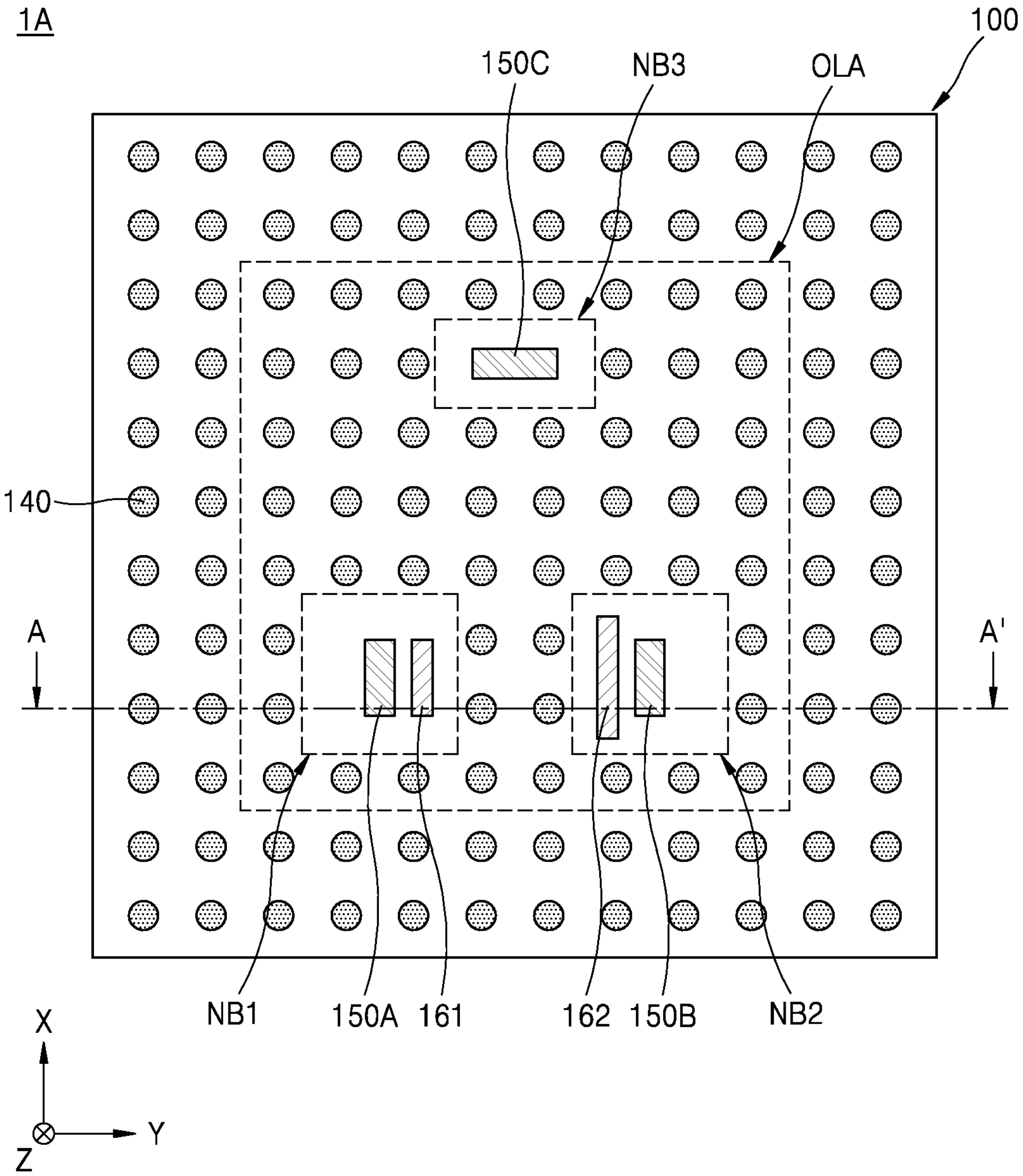
FIG. 1 is a plan view illustrating a semiconductor package according to one or more embodiments.

Hereinafter, embodiments of the present disclosure are described in detail with reference to the accompanying drawings. The same reference numerals are used for the same components in the drawings, and descriptions already given for them are omitted.

It will be understood that, although the terms first, second, third, fourth, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

A layer may be described as having an upper surface and a lower surface. As understood by one of ordinary skill in the art, the surfaces of a layer may also be described as first and second surfaces, where a first surface may be one of the upper surface and the lower surface of the layer, and the second surface may be the other of the upper surface and the lower surface of the layer.

Figure 2:
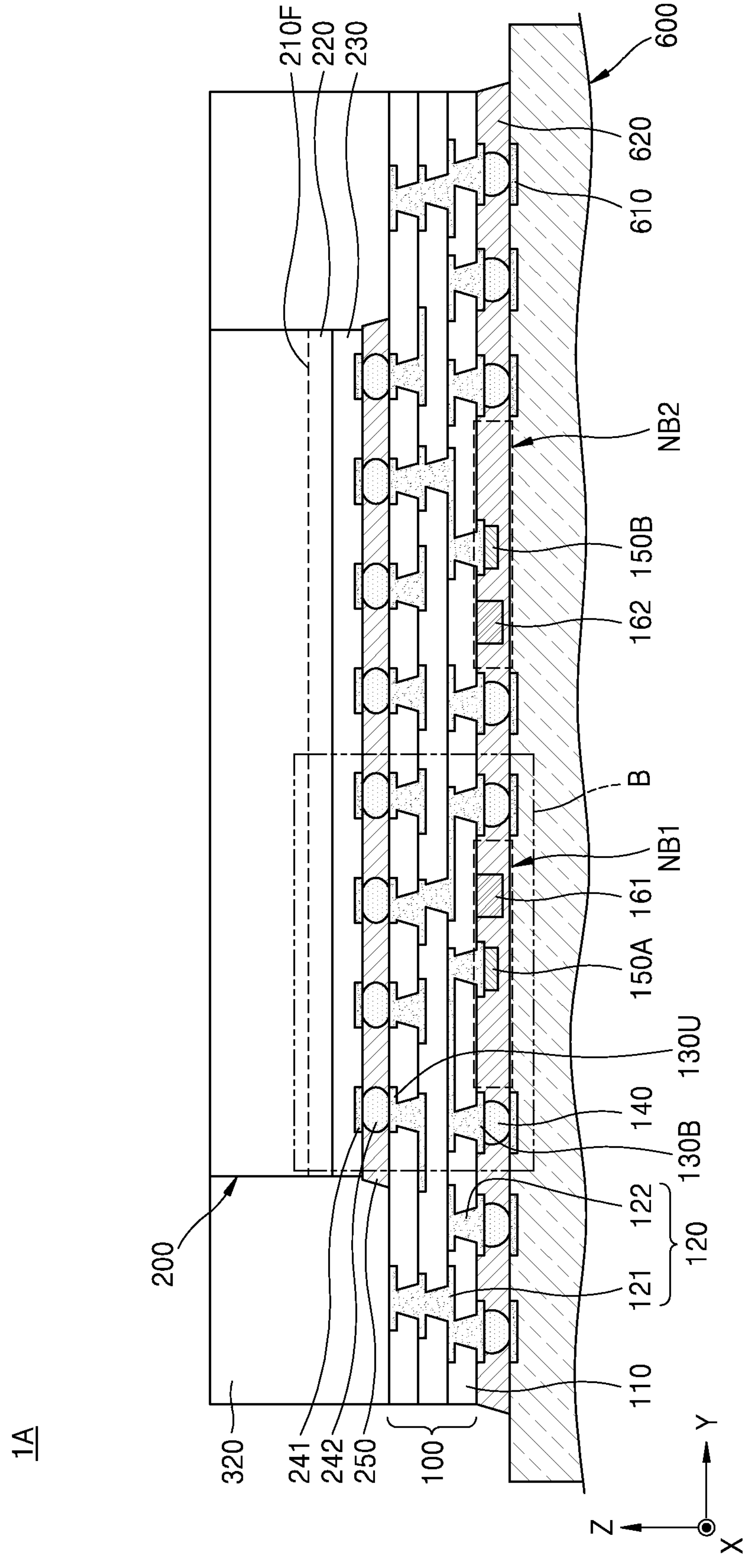
FIG. 2 is a cross-sectional view taken along line AA' of the semiconductor package of FIG. 1 according to one or more embodiments.
Figure 3:
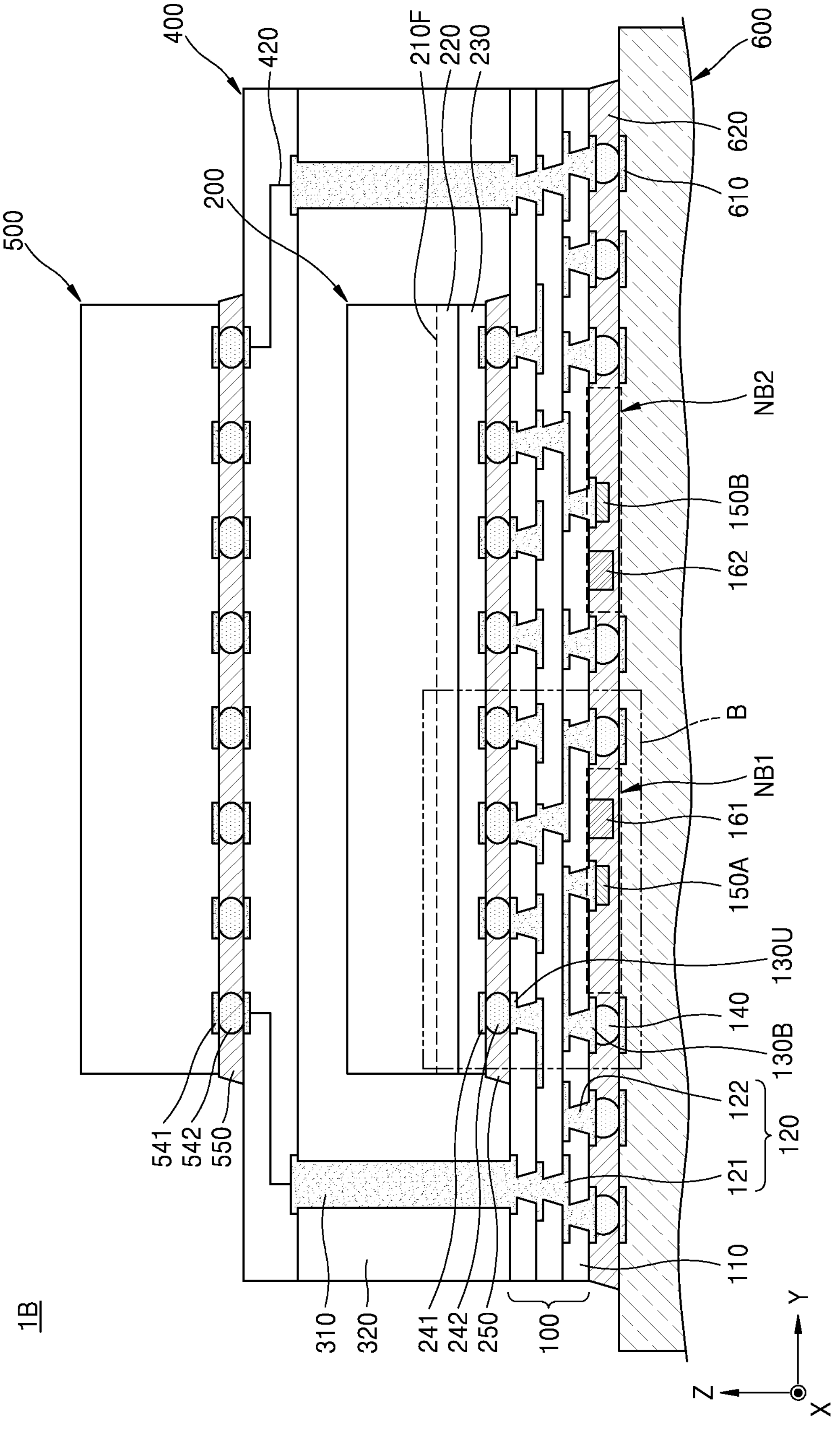
FIG. 3 is a cross-sectional view taken along the same line AA' as that of FIG. 2 in the semiconductor package according to one or more embodiments.
Figure 4:
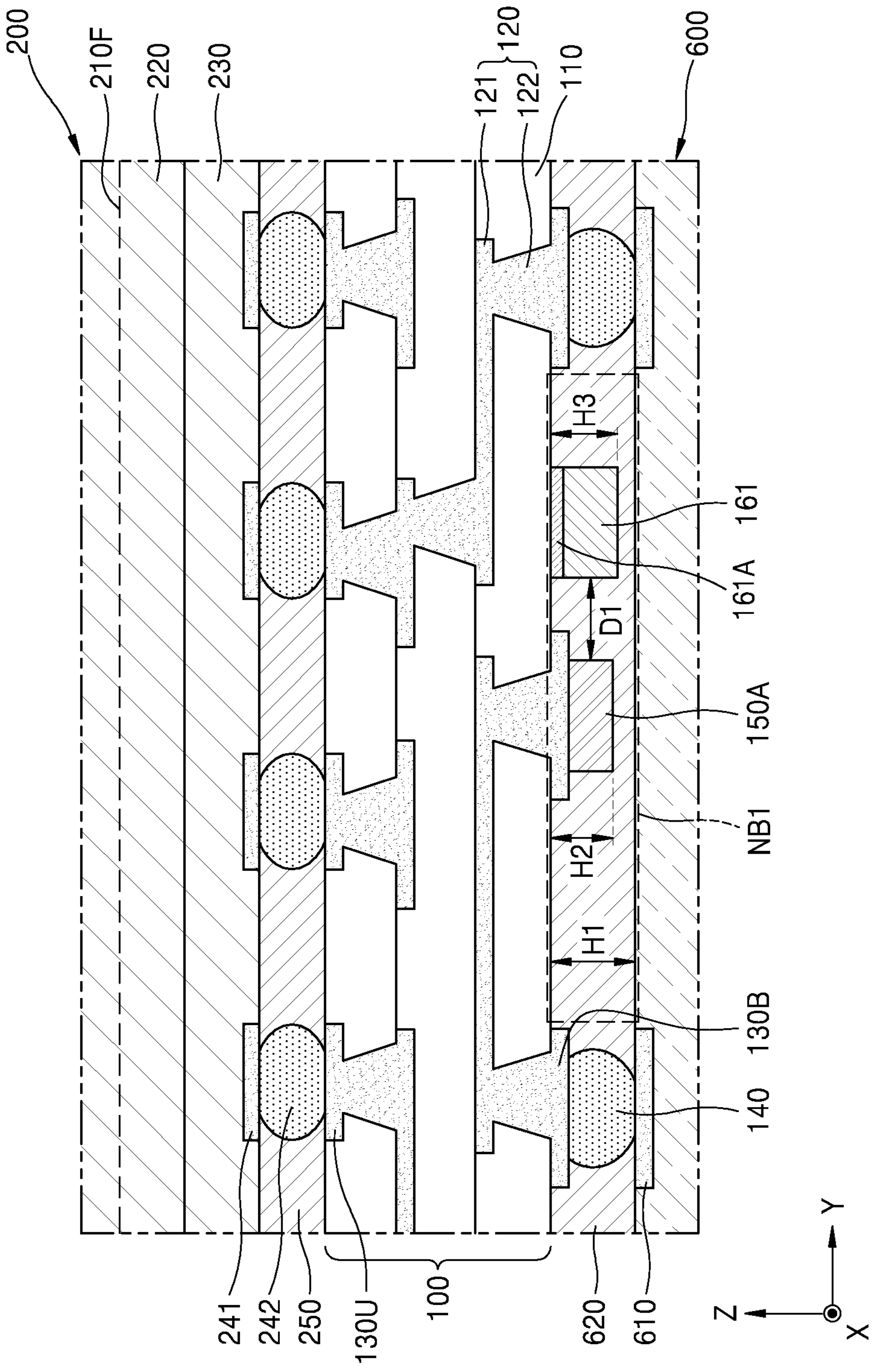
FIG. 4 is an enlarged view of a portion B of the cross-sectional view of the semiconductor package of FIG. 2 according to one or more embodiments.
Figure 5:
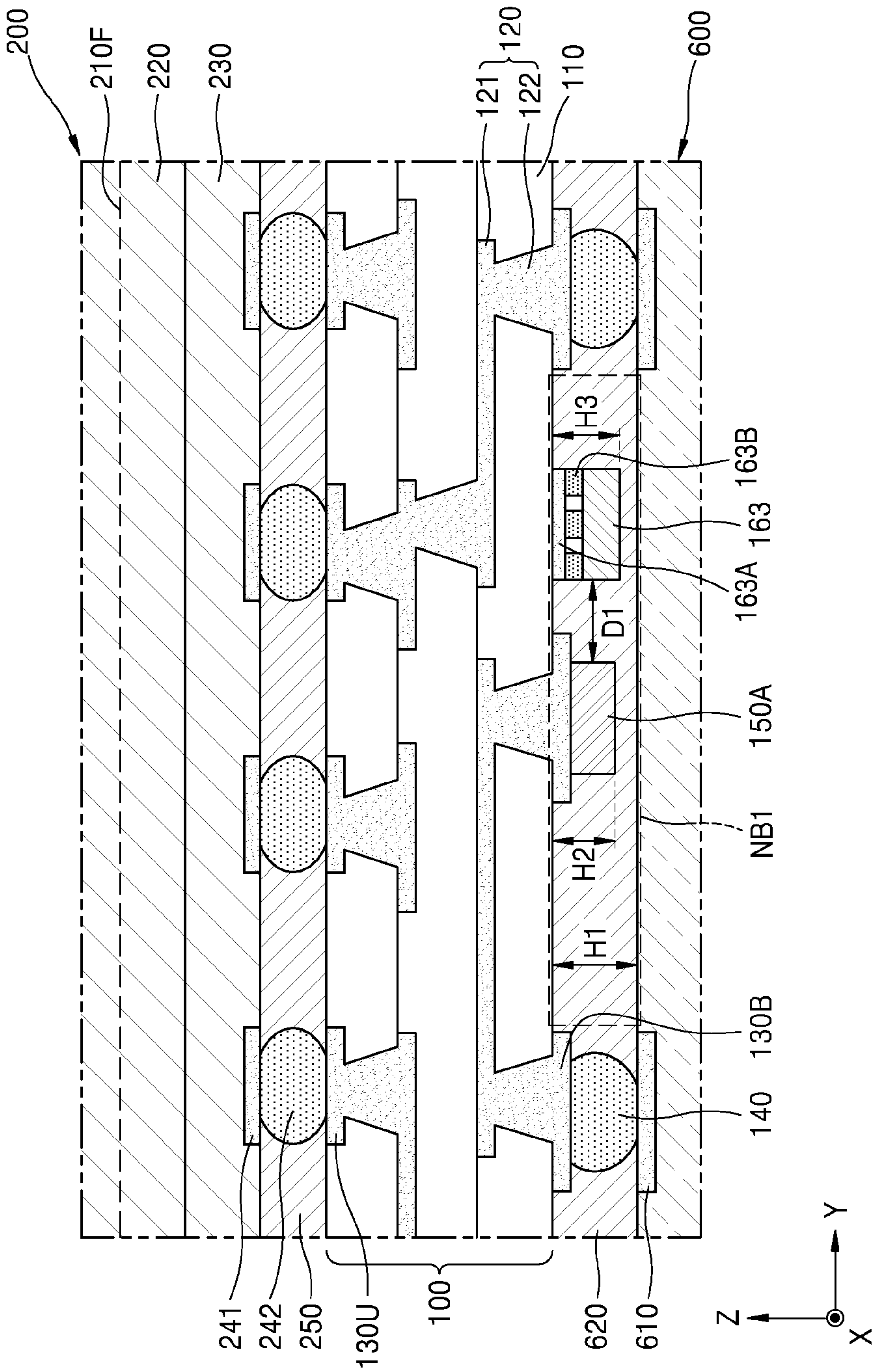
FIG. 5 is an enlarged view of the portion B as shown in FIG. 4 in a cross-section of a semiconductor package according to one or more embodiments.

FIG. 1 is a plan view illustrating a semiconductor package 1A according to one or more embodiments. FIG. 2 is a cross-sectional view taken along line AA' of the semiconductor package of FIG. 1 according to one or more embodiments. FIG. 3 is a cross-sectional view taken along the same line AA' as that of FIG. 2 in the semiconductor package according to one or more embodiments. FIG. 4 is an enlarged view of a portion B of the cross-sectional view of the semiconductor package of FIG. 2 according to one or more embodiments. FIG. 5 is an enlarged view of the portion B as shown in FIG. 4 in a cross-section of a semiconductor package 1A according to one or more embodiments.

Referring to FIGS. 1 to 5, the semiconductor package 1A may include a first redistribution structure 100 and an internal semiconductor device 200 mounted on the first redistribution structure 100. A semiconductor package 1B (FIG. 3) according to one or more embodiments may include a first redistribution structure 100 and the internal semiconductor device 200 mounted on the first redistribution structure 100, and may further include a plurality of conductive posts 310 disposed around the internal semiconductor device 200 and spaced apart from the internal semiconductor device 200, a second redistribution structure 400 disposed on the internal semiconductor device 200, and an upper semiconductor device 500 mounted on the second redistribution structure 400. Because most of the description of the semiconductor package 1A, which is one or more embodiments, is included in the description of the semiconductor package 1B, most of the description of the semiconductor package 1A may be replaced by a description of the semiconductor package 1B.

The semiconductor package 1B may be a fan-out semiconductor package in which a horizontal width and a horizontal area of the first redistribution structure 100 are larger than those of the internal semiconductor device 200. In one or more examples, the term horizontal refers to an X-Y plane, the first horizontal direction refers to an X-axis direction, and the second horizontal direction refers to a Y-axis direction. In some embodiments, the semiconductor package 1B may be a fan-out wafer level package (FOWLP) or a fan-out panel level package (FOPLP). A semiconductor package 1G, which is one or more embodiments in the case of a panel level package, is described below with reference to FIG. 9.

In some embodiments, the first redistribution structure 100 may be formed by a redistribution process. In one or more examples, the first redistribution structure 100 may be referred to as a first package substrate. The first package substrate includes a printed circuit board (PCB) substrate. A case in which the first package substrate is the PCB substrate is described below with reference to FIG. 10.

The first redistribution structure 100 may include a redistribution insulating layer 110 and a plurality of redistribution patterns 120. The redistribution insulating layer 110 may cover the plurality of redistribution patterns 120. In some embodiments, the first redistribution structure 100 may include a plurality of stacked redistribution insulating layers 110. The redistribution insulating layer 110 may be formed of, for example, photo imageable dielectric (PID) or photosensitive polyimide (PSPI).

The plurality of redistribution patterns 120 may include a plurality of redistribution line patterns 121 and a plurality of redistribution via patterns 122. The plurality of redistribution patterns 120 may be, for example, a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru) or an alloy of the metal, but is not limited thereto.

As illustrated in FIG. 2, the plurality of redistribution line patterns 121 may be disposed on at least one of upper and lower surfaces of the redistribution insulating layer 110. For example, when the first redistribution structure 100 includes a plurality of stacked redistribution insulating layers 110, the plurality of redistribution line patterns 121 may be disposed between an upper surface of the uppermost redistribution insulating layer 110, a lower surface of the lowermost redistribution insulating layer 110, and adjacent redistribution insulating layers 110. As illustrated in FIG. 2, the plurality of redistribution line patterns 121 extend in the Y direction, and the plurality of redistribution via patterns 122 extend in the X direction.

The plurality of redistribution via patterns 122 may pass through the redistribution insulating layer 110 and be connected to some of the plurality of redistribution line patterns 121. In some embodiments, the plurality of redistribution via patterns 122 may have a tapered shape extending from an upper side of a first redistribution layer to a lower side of a second redistribution layer with a larger horizontal width. In the tapered shape of the plurality of redistribution via patterns 122, the direction in which the horizontal width of the tapered shape increases may vary depending on the process of the structure, or may vary depending on the process of the first redistribution structure 100. As understood by one of ordinary skill in the art, the embodiments of the present disclosure are not limited by the shape of the plurality of redistribution via patterns 122.

In some embodiments, one or more of the plurality of redistribution line patterns 121 may be formed together with one or more of the plurality of redistribution via patterns 122 to form an integral body. For example, the redistribution line pattern 121 and the redistribution via pattern 122 contacting the lower surface of the redistribution line pattern 121 may be formed together to form an integral body.

Among the plurality of redistribution patterns 120, one or more of the redistribution patterns 120 disposed adjacent to the lower surface of the first redistribution structure 100 may be referred to as a plurality of first lower surface connection pads 130B and one or more of the redistribution patterns 120 disposed adjacent to the upper surface of the first redistribution structure 100 may be referred to as a plurality of first upper surface connection pads 130U. For example, the plurality of first lower surface connection pads 130B may be one or more of the plurality of redistribution line patterns 121 disposed adjacent to the lower surface of the first redistribution structure 100, and the plurality of upper surface connection pads 130U may be one or more of the plurality of redistribution line patterns 121 disposed adjacent to the upper surface of the first redistribution structure 100. Accordingly, each redistribution pattern 120 may be one of an upper surface connection pad 130U or a lower surface connection pad 130B.

A plurality of external connection terminals 140 may be respectively attached to the plurality of first lower surface connection pads 130B. The plurality of external connection terminals 140 may connect the semiconductor package 1B to an external substrate 600. The external substrate 600 may be a printed circuit board (PCB) substrate on which other semiconductor devices are mounted. A plurality of external substrate pads 610 disposed on the upper surface of the external substrate 600 may be electrically connected to the plurality of first lower surface connection pads 130B disposed on the lower surface of the first redistribution structure 100 through the plurality of external connection terminals 140. In some embodiments, the plurality of external connection terminals 140 may be solder bumps or solder balls. In one or more examples, a plurality of chip connecting members 242 may be attached to one or more of the plurality of first upper surface connection pads 130U, and a plurality of conductive posts 310 may be disposed to other one or more of the plurality of first upper surface connection pads 130U.

The plurality of upper surface connection pads 130U may be disposed on an upper surface of the redistribution insulating layer 110. For example, when the first redistribution structure 100 includes a plurality of stacked redistribution insulating layers 110, the plurality of upper surface connection pads 130U may be disposed on the upper surface of the uppermost redistribution insulating layer 110.

As illustrated in FIG. 3, at least one internal semiconductor device 200 may be mounted on the first redistribution structure 100. For example, a single internal semiconductor device 200 or a plurality of internal semiconductor devices 200 may be mounted on the first redistribution structure 100. The internal semiconductor device 200 may include a semiconductor substrate 210 having an active surface 210F and an inactive surface facing each other, a front end of line layer (FEOL) 220 formed on the active surface 210F of the semiconductor substrate 210, a back end of line (BEOL) layer 230 provided under the FEOL layer 220, and a plurality of chip pads 241 disposed on a first surface of the internal semiconductor device 200. For example, the internal semiconductor device 200 may have a thickness of about 150 μm or more in a vertical direction.

In one or more examples, the first and second surfaces of the internal semiconductor device 200 face each other, and the second surface of the internal semiconductor device 200 refers to the inactive surface 310B of the semiconductor substrate 210. An active surface 210F of the semiconductor substrate 210 may be adjacent to the first surface of the internal semiconductor device 200. Therefore, the FEOL layer 220 and the BEOL layer 230 corresponding to the semiconductor element layers may be thicker than the actual semiconductor device 300.

In some embodiments, the internal semiconductor device 200 may have a face down arrangement with the first surface facing the first redistribution structure 100 and may be mounted on an upper surface of the first redistribution structure 100. In this case, the first surface of the internal semiconductor device 200 may be referred to as a lower surface of the internal semiconductor device 200, and the second surface of the internal semiconductor device 200 may be referred to as an upper surface of the internal semiconductor device 200.

A plurality of chip connection members 242 may be between the plurality of chip pads 241 of the internal semiconductor device 200 and one or more of the plurality of first upper surface connection pads 130U of the first redistribution structure 100. For example, each of the plurality of chip connecting members 242 may be a solder ball or a micro bump. The internal semiconductor device 200 and the redistribution pattern 120 of the first redistribution structure 100 may be electrically connected to each other through a plurality of chip connection members 242. The plurality of chip connection members 242 may include an under bump metal (UBM) layer disposed on the plurality of chip pads and a conductive connection member covering the UBM layer. The plurality of chip connecting members 242 may be formed of, for example, copper (Cu), aluminum (Al), silver (Ag), tin (Tin), gold (Au), or solder, but are not limited thereto.

The semiconductor substrate 210 may include, for example, a semiconductor material, such as silicon (Si) or germanium (Ge). In one or more examples, the semiconductor substrate 210 may include compound semiconductor materials, such as silicon carbide (SiC), gallium arsenide (GaAs), indium arsenide (InAs), and indium phosphide (InP). The semiconductor substrate 210 may include a well doped with impurities, which may operate as a conductive region. The semiconductor substrate 210 may have various device isolation structures, such as a shallow trench isolation (STI) structure.

A semiconductor device including a plurality of individual devices of various types may be formed on the active surface of the semiconductor substrate 210. The plurality of individual devices may be electrically connected to the conductive region of the semiconductor substrate 210. The semiconductor device may further include a conductive line or a conductive plug electrically connecting the plurality of individual devices to the conductive region of the semiconductor substrate 210. In addition, each of the plurality of individual elements may be electrically separated from other neighboring individual elements by an insulating film.

In some embodiments, the internal semiconductor device 200 may include a logic device. For example, the internal semiconductor device 200 may be a central processing unit chip, a graphics processing unit chip, or an application processor (AP). In other embodiments, when the semiconductor package 1 includes a plurality of internal semiconductor devices 200, one of the plurality of internal semiconductor devices 200 may be a central processing unit chip, a graphics processing unit chip, or an application processor chip, and another one of the internal semiconductor devices 200 may be a memory semiconductor chip including a memory device. As understood by one of ordinary skill in the art, in one or more examples, the semiconductor package 1 may include only internal semiconductor devices 200 that are processors, or only internal semiconductor devices 200 that are memory chips.

The memory device may be a non-volatile memory device, such as a flash memory, a phase-change random access memory (PRAM), a magnetic random access memory (MRAM), a ferroelectric random access memory (FeRAM), or a resistive random access memory (RRAM). In some embodiments, the memory device may be a volatile memory device, such as dynamic random access memory (DRAM) or static random access memory (SRAM).

In one or more examples, the internal semiconductor device 200 may be a semiconductor device in which a plurality of semiconductor chips are vertically stacked. The plurality of semiconductor chips may be stacked semiconductor chips including through-silicon vias (TSVs).

An encapsulant 320 may cover the internal semiconductor device 200 and a plurality of conductive posts 310 (FIG. 3) on the upper surface of the first redistribution structure 100. The encapsulant 320 may fill a space between the first redistribution structure 100 and the second redistribution structure 400 to be described below. For example, the encapsulant 320 may have a thickness of about 150 μm to about 500 μm. For example, the encapsulant 320 may be a molding member including an epoxy mold compound (EMC). The encapsulant 320 may further include a filler. In the semiconductor package 1A, according to one or more embodiments, as shown in FIG. 1, a vertical level of the upper surface of the encapsulant 320 may be the same as a vertical level of the upper surface of the internal semiconductor device 200. In one or more examples, the vertical level of the upper surface of the encapsulant 320 may be higher than the vertical level of the upper surface of the internal semiconductor device 200.

In some embodiments, a first underfill layer 250 surrounding the plurality of chip connection members 242 may be between the internal semiconductor device 200 and the first redistribution structure 100. In some embodiments, the first underfill layer 250 may fill a space between the internal semiconductor device 200 and the first redistribution structure 100 and may cover a lower portion of a side surface of the internal semiconductor device 200. The first underfill layer 250 may be formed by, for example, a capillary underfill process and made of an epoxy resin.

In some embodiments, the side surface of the first redistribution structure 100, the side surface of the encapsulant 320, and the side surface of the second redistribution structure 400 may be aligned with each other in the vertical direction to form a coplanar surface.

The plurality of conductive posts 310 may penetrate the encapsulant 320 and electrically connect the first redistribution structure 100 to the second redistribution structure 400. The plurality of conductive posts 310 may be spaced apart from the internal semiconductor device 200 in a horizontal direction and provided between the first redistribution structure 100 and the second redistribution structure 400. For example, the plurality of conductive posts 310 may be spaced apart from the internal semiconductor device 300 in a horizontal direction and may be disposed outside the internal semiconductor device 200 on the upper surface of the first redistribution structure 100. In one or more examples, the second redistribution structure 400 may be referred to as a second package substrate.

In one or more examples, the plurality of conductive posts 310 may be between a plurality of first upper surface connection pads 130U and a plurality of second lower surface connection pads to be described below. The plurality of second lower surface connection pads may be provided on the lower surface of the second redistribution structure. Bottom surfaces of the plurality of conductive posts 410 may contact the plurality of upper surface connection pads 130U on the upper surface of the first redistribution structure 100 to be electrically connected to the plurality of redistribution patterns 120 by, and upper surfaces of the plurality of conductive posts 310 may contact the plurality of second lower surface connection pads of the second redistribution structure 400 to be electrically connected to the plurality of redistribution patterns 420.

In one or more examples, similar to the first redistribution structure 100, the second redistribution structure 400 may include a redistribution insulating layer and a plurality of redistribution patterns 420. The redistribution insulating layer may cover the plurality of redistribution patterns 420. In FIG. 2, the configuration of the second redistribution structure 400 is substantially the same as that of the first redistribution structure 100. Therefore, the description already given for the second redistribution structure 400 may be omitted.

Referring to FIG. 3, the upper semiconductor device 500 may be mounted on the second upper surface connection pad located on the upper surface of the second redistribution structure 400. The upper semiconductor device 500 may be a semiconductor package including a semiconductor chip. Accordingly, the semiconductor package 1B according to one or more embodiments may have a package-on-package (POP) structure.

A plurality of connection members 542 may be interposed between the plurality of connection pads 541 provided under the upper semiconductor device 500 and the plurality of secondary upper surface connection pads provided on the upper surface of the second redistribution structure 400. For example, each of the plurality of connection members 542 may be a solder ball or a micro bump. The plurality of connecting members 542 may be formed of, for example, copper (Cu), aluminum (Al), silver (Ag), tin (Tin), gold (Au), or solder, but are not limited thereto.

In some embodiments, a second underfill layer 550 surrounding the plurality of connection members 542 may be between the upper semiconductor device 500 and the second redistribution structure 400. The second underfill layer 550 may fill a space between the upper semiconductor device 500 and the second redistribution structure 400 and may cover a lower portion of a side surface of the upper semiconductor device 500. The second underfill layer 550 may be formed by, for example, a capillary underfill process and made of an epoxy resin.

The semiconductor chip included in the upper semiconductor device 500 may be a semiconductor chip including a non-volatile memory device, such as a flash memory, a phase-change random access memory (PRAM), a magnetic random access memory (MRAM), a ferroelectric random access memory (FeRAM), or a resistive random access memory (RRAM). In some embodiments, the memory device may be a semiconductor chip including a volatile memory device, such as dynamic random access memory (DRAM) or static random access memory (SRAM).

The semiconductor chip included in the upper semiconductor device 500 may be a central processing unit chip, a graphics processing unit chip, or an application processor chip. In other embodiments, when the upper semiconductor device 500 includes a plurality of semiconductor chips, one of the plurality of semiconductor chips may be a central processing unit chip, a graphics processing unit chip, or an application processor chip, and another one of the plurality of semiconductor chips may be a memory semiconductor chip including a memory device.

Because the upper semiconductor device 500 is electrically connected to the second upper surface connection pad, the conductive posts 410 and the first redistribution structure 100, the upper semiconductor device 500 may be electrically connected to the internal semiconductor device 200. In addition, the upper semiconductor device 500 may exchange electrical signals with external devices through the plurality of external connection terminals 140 and the external substrate pad 610.

Passive elements 150 may be provided on a first lower surface connection pad 130B on the lower surface of the first redistribution structure 100. The passive element 150 may be any one of a capacitor, an inductor, and a resistor. For example, a first passive element 150A (FIG. 1), a second passive element 150B (FIG. 1), and a third passive element 150C (FIG. 5) may be provided on the first lower surface connection pad 130B disposed on the lower surface of the first redistribution structure 100. The first passive element 150A, the second passive element 150B, and the third passive element 150C may be any one of a capacitor, an inductor, and a resistor.

On the lower surface of the first redistribution structure 100, a first external connection terminal 140 may be spaced apart from the passive elements around the passive elements. For example, as shown in FIG. 1, the first passive element 150A may be spaced apart from the adjacent external connection terminal 140 by a certain distance. Similarly, the second passive element 150B and the third passive element 150C may be spaced apart from the adjacent external connection terminal 140 by a certain distance. For example, an area where the external connection terminal 140 is not provided exists around the first passive element 150A, the second passive element 150B, and the third passive element 150C.

As in FIG. 1, an area adjacent to the first passive element 150A and not provided with the external connection terminal 140 may be referred to as a first non-connection terminal area NB1. An area adjacent to the second passive element 150B and not provided with the external connection terminal 140 may be referred to as a second non-connection terminal area NB2. An area adjacent to the third passive element 150C and not provided with the external connection terminal 140 may be referred to as a third non-connection terminal area NB3. The first non-connection terminal area NB1, the second non-connection terminal area NB2, and the third non-connection terminal area NB3 may be referred to as a first no-solder ball area, a first no-solder ball area, and a third no-solder ball area, respectively.

In the semiconductor package 1B according to one or more embodiments, a floating structure may be provided in a non-connection terminal area. As one or more embodiments, a first floating structure 161 may be provided in the first non-connection terminal area NB1. A second floating structure 162 may be provided in the second non-connection terminal area NB2. A floating structure may not be provided in the third non-connection terminal area NB3. In one or more examples, the first floating structure 161 to the ninth floating structure 169 (FIG. 8) may be collectively referred to as a floating structure 160. In addition, in one or more examples, the first passive element 150A to the third passive element 150C may be collectively referred to as the passive element 150.

The first floating structure 161 may be between the first passive element 150A and the adjacent external connection terminal 140. The first passive element 150A may have a shape extending in a first horizontal direction (X-axis direction). The second passive element 150B may have a shape extending in the first horizontal direction (X-axis direction). The third passive element 150C may have a shape extending in a second horizontal direction (Y-axis direction). For example, as illustrated in FIGS. 1 and 5, an element having a shape extending in the X-axis direction refers to the element having a length in the X-axis direction that is longer than a length of the element in the Y-axis direction. Similarly, an element having a shape extending in the Y-axis direction refers to the having a length in the Y-axis direction that is longer than a length of the element in the X-axis direction.

As one or more embodiments, the first floating structure 161 may have a shape extending in a first horizontal direction (X-axis direction). In other words, the first floating structure 161 may have a shape extending in the first horizontal direction (X-axis direction) similarly to the first horizontal direction (X-axis direction), which is the direction in which the first passive element 150A extends. In one or more examples, the longitudinal direction of a specific element refers to an extension direction of the specific element. For example, the longitudinal direction of the first passive element **150*a* is a first horizontal direction (X-axis direction), the longitudinal direction of the first floating structure 161 is a first horizontal direction, and the longitudinal direction of the third passive element 150**C is the second horizontal direction (Y-axis direction).

In one or more examples, the overlapping area OLA may refer to a boundary of a shape in which the internal semiconductor device 200 overlaps the lower surface of the first redistribution structure 100 in a vertical direction (Z-axis direction) perpendicular to a horizontal plane (X-Y plane). For example, in the semiconductor package 1B, according to one or more embodiments, the overlapping area OLA may be formed in a rectangular shape on the lower surface of the first redistribution structure 100. As one or more embodiments, the first floating structure 161 and the second floating structure 162 may be provided on the lower surface of the first redistribution structure 100 in the overlapping area OLA.

A third underfill layer 620 may be between the first redistribution structure 100 and the external substrate 600. The third underfill layer 620 may be formed by, for example, a capillary underfill process and made of an epoxy resin. The first passive element 150A, the second passive element 150B, the third passive element 150C, the plurality of external connection terminals 140, the first floating structure 161, and the second floating structure 162 may be surrounded by a third underfill layer 620.

In some embodiments, the floating structure may be insulated. For example, the first floating structure 161 and the second floating structure 162 may be insulated. In addition, the floating structure may be made of a material including a polymer or silicon. For example, the first floating structure 161 and the second floating structure 162 may be made of a material including polymer or silicon. Insulation and constituent materials may be applied to all floating structures In one or more examples, not just the first floating structure 161 and the second floating structure 162. Therefore, the description already given for this is omitted below.

The first floating structure 161 may be disposed parallel to the first passive element 150A. In one or more examples, two components that are parallel to each other may refer to the longitudinal directions of each component being parallel to each other. In addition, the second floating structure 162 may be disposed parallel to the second passive element 150B.

The first horizontal length of the first floating structure 161 may be substantially the same as the first horizontal length of the first passive element 150A. On the other hand, the first horizontal length of the second floating structure 162 may be longer than the first horizontal length of the second passive element 150B.

As one or more embodiments, the first floating structure 161 may be provided between the first passive element 150A and the external connection terminal 141, and the second floating structure 162 may be provided between the second passive element 150B and the external connection terminal 141. At the same time, the first floating structure 161 and the second floating structure 162 may be disposed between the first passive element 150A and the second passive element 150B.

As one or more embodiments, as shown in FIG. 1, the first passive element 150A and the first floating structure 161 may be parallel in the first horizontal direction (X-axis direction). At the same time, the second floating structure 162 may be parallel to the first floating structure 161 in the first horizontal direction (X-axis direction).

In one or more examples, similar to the third non-connection terminal area NB3, even if the third passive element 150C is disposed, a floating structure may not be provided in the third non-connection terminal area NB3 when another passive element is not disposed adjacent thereto. In one or more examples, the first and second non-connection terminal areas NB1 and NB2, the floating structure may not be disposed in the third non-connection terminal area NB3 having a relatively small horizontal area. For example, a person skilled in the art may decide whether or not to place a floating structure as needed.

As illustrated in FIG. 4, the floating structure 160 may be attached to the lower surface of the first redistribution structure 100 through an adhesive layer. In one or more embodiments, the first floating structure 161 may be positioned on the lower surface of the first redistribution structure 100 by an adhesive layer 161A. After the first passive element 150A is mounted on the lower surface of the first redistribution structure 100 or before the first passive element 150A is mounted on the lower surface of the first redistribution structure 100, the first floating structure 161 may be disposed on a lower surface of the first redistribution structure 100.

As shown in FIG. 5, in the semiconductor package 1C according to one or more embodiments, the floating structure 160 may be attached to the lower surface of the first redistribution structure 100 through connection terminals such as solder balls. As one or more embodiments, the first floating structure 163 may be positioned on the lower surface of the first redistribution structure 100 through a floating connection terminal 163B. The floating connection terminal 163B may be a solder ball. Alternatively, the first floating structure 163 may be disposed by bonding to the dummy pad 163A provided in the process of forming the first redistribution structure 100 through the floating connection terminal 163B. In this case, the first floating structure 163 may be disposed together in the process of mounting the first passive element 150A.

Referring to FIGS. 4 and 5, a vertical level difference between the lower surface of the first redistribution structure 100 and the external substrate 600 may be referred to as a first height H1, a vertical level difference between the lower surface of the first passive element 150A and the lower surface of the first redistribution structure 100 may be referred to as a second height H2, and a vertical level difference between the lower surface of the first floating structure 161 and the lower surface of the first redistribution structure 100 may be referred to as a third height H3.

The first height H1 is the distance between the lower surface of the first redistribution structure 100 and the upper surface of the external substrate 600, and is equal to the thickness of the third underfill layer 620 between the first redistribution structure 100 and the external substrate 600 in the vertical direction.

The second height H2 may be less than the first height H1. The third height H3 may be less than the first height H1. The third height H3 may be less than, equal to, or larger than the second height H2. The third height H3 may be greater than the second height H2 and less than the first height H1. Due to the range of the third height H3, the distance between the lower surface of the first redistribution structure 100 and the external substrate 600 is short, preventing excessive proximity. By limiting the distance between the lower surface of the first redistribution structure 100 and the external substrate 600 to a predetermined distance or more, the third underfill layer 620 may be more smoothly interposed between the lower surface of the first redistribution structure 100 and the external substrate 600. Such a height range may be applied not only to the first floating structure 161 but also to other floating structures.

Referring to FIGS. 4 and 5, the first passive element 150A and the first floating structure 161 may be spaced apart from each other by a first distance D1. The first distance D1 may be about 50 μm or more. A separation distance between the first passive element 150A and the first floating structure 161 may be greater than or equal to the first distance D1 so that the third underfill layer 620 is smoothly interposed between the first passive element 150A and the first floating structure 161.

In some embodiments, in a semiconductor package including a passive element and an external connection terminal 140 disposed around the passive element, and the third underfill layer 620 surrounding the passive element and the external connection terminal 140, the passive element may be horizontally spaced apart from the external connection terminal 140 with the third underfill layer 620 therebetween. When the passive element is disposed in the overlapping area OLA, heat generated from the internal semiconductor device 200 may be transferred to the third underfill layer 620 through the first redistribution structure 100. In the area of the non-connection terminal provided with the passive element, the volume of the material constituting the underfill layer is relatively greater than the area where the connection terminal is provided. In one or more examples, the underfill layer may have a greater coefficient of thermal expansion (CTE) than CTE of the substrate and the redistribution structure located nearby. Due to this, when the temperature of the semiconductor package is generally raised due to heat generation of the semiconductor chip, the underfill layer may experience greater thermal expansion than the surrounding structure. Due to the relatively great thermal expansion of the underfill layer, defects such as cracks may occur in the external connection terminal 140 electrically connecting the redistribution structure to the external substrate, and thus the reliability of the semiconductor package may deteriorate.

In the semiconductor package 1B according to the embodiment, a floating structure made of a material including may be between the first redistribution structure 100 and the external substrate 600, where the silicon or the polymer has a relatively less coefficient of thermal expansion than epoxy mold compound (EMC), which is a material constituting the underfill layer.

By disposing a floating structure having a less coefficient of thermal expansion than the material constituting the underfill layer between the first redistribution structure 100 and the external substrate 600, when the overall temperature of the semiconductor package rises due to heat generation of the semiconductor chip, thermal expansion generated in the underfill layer may be reduced compared to a case where the floating structure is not present. In addition, because the floating structure is provided in the non-connection terminal area, the volume of the third underfill layer 620 in the non-connection terminal area may be reduced. For example, even if the temperature of the semiconductor package is increased, thermal expansion of the underfill is reduced, thereby advantageously preventing or reducing defects that may occur in the external connection terminal 140 covered by the underfill. Accordingly, reliability of the semiconductor package 1B may be improved through the semiconductor package 1B according to one or more embodiments.

As shown in FIG. 1, the first non-connection terminal area NB1 including the first passive element and the second non-connection terminal area NB2 including the second passive element may be positioned with the external connection terminal 140 therebetween. The volume of the underfill in the first non-connection terminal area NB1 and the second non-connection terminal area NB2 is greater than that of the area where the connection terminals are disposed. In addition, because the first non-connection terminal area NB1 and the second non-connection terminal area NB2 are located in the overlapping area OLA, the temperature of the underfill in the first and second non-connection terminal areas NB1 and NB2 may be more easily raised. Therefore, the external connection terminal 140 provided between the first non-connection terminal area NB1 and the second non-connection terminal area NB2 may have a defect such as a crack of the external connection terminal 140 provided between the first non-connection terminal area NB1 and the second non-connection terminal area NB2 due to thermal expansion of the underfill on both sides.

As shown in FIG. 3, in the semiconductor package 1B according to the embodiment, the first floating structure 161 may be provided between the first passive element 150A and the external connection terminal 141, and the second floating structure 162 may be provided between the second passive element 150B and the external connection terminal 141, so as to prevent or reduce defects in the external connection terminal 140 provided between the first second and second non-connection terminal area NB1 and NB2. The first floating structure 161 and the second floating structure 162 may be disposed between the first passive element 150A and the second passive element 150B. Based on this configuration, thermal expansion due to temperature rise occurring in the first and second non-connection terminal areas NB1 and NB2 may be reduced.

Accordingly, through the semiconductor package 1B according to one or more embodiments, reliability of the semiconductor package 1B may be improved by preventing or reducing defects that may occur in the external connection terminal 140 provided between the first and second non-connection terminal areas NB1 and NB2.

Figure 6:
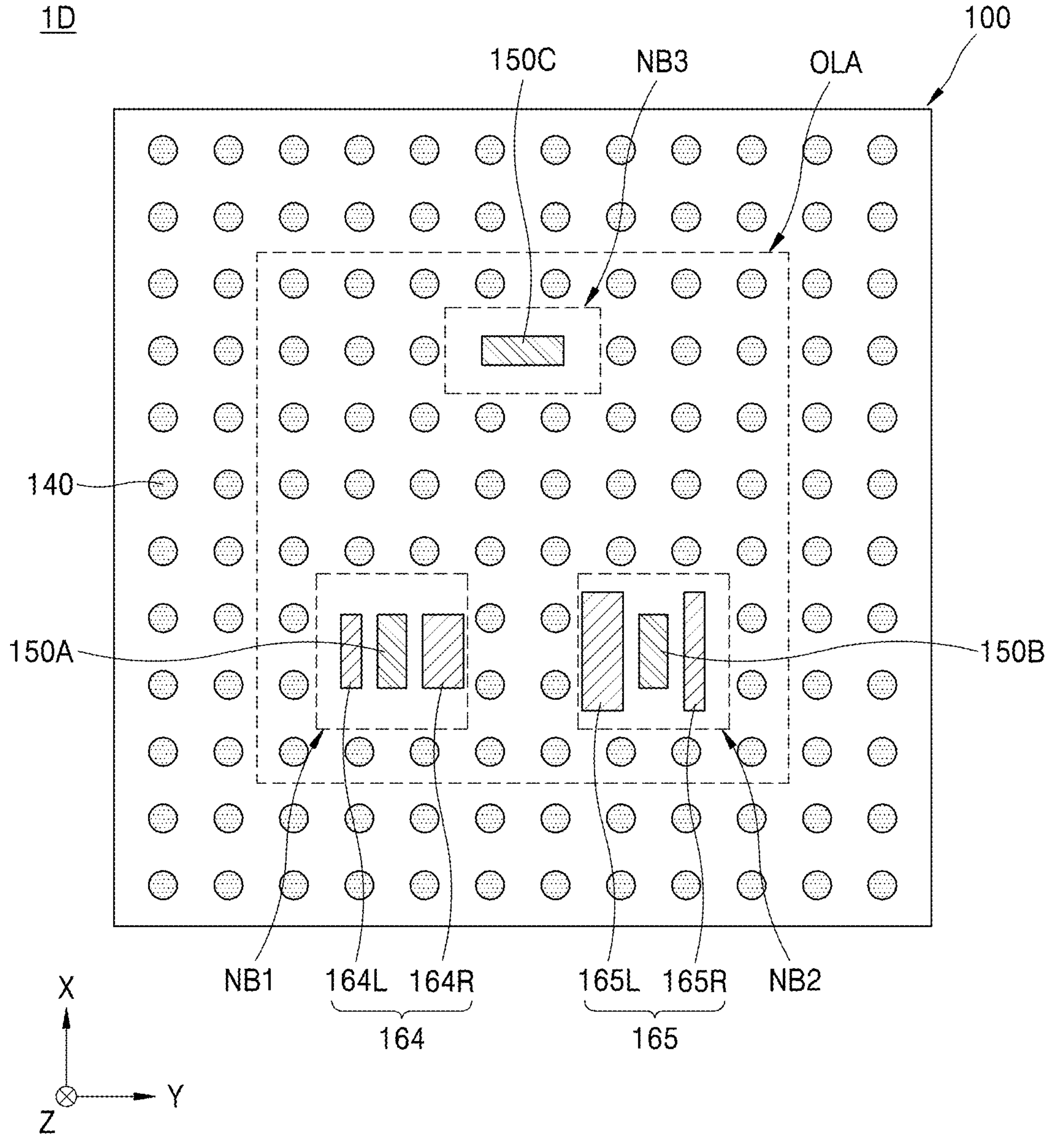
FIG. 6 is a plan view illustrating a semiconductor package according to one or more embodiments.

FIG. 6 is a plan view illustrating a semiconductor package 1D according to one or more embodiments.

Referring to FIG. 6, on one side of the passive element 150, a floating structure may be located spaced apart from the passive element 150, and the floating structure may be spaced apart from the passive element 150 on the other side opposite to the place where the floating structure is disposed. For example, the passive element 150 may be provided between the two floating structures. For example, as shown in FIG. 6, a fourth floating structure 164 may include a left fourth floating structure 164L and a right fourth floating structure 164R. The right fourth floating structure 164R closer to the center of the lower surface of the first redistribution structure 100 may be referred to as an inner fourth floating structure. In addition, the right fourth floating structure 164R closer to the center of the lower surface of the structure 100 may be referred to as an inner fourth floating structure.

In one or more examples, a fifth floating structure 165 may include a left fifth floating structure 165L and a right fifth floating structure 165R. In the fifth floating structure 165, a right fifth floating structure 165R located farther from the center of the lower surface of the first redistribution structure 100 may be referred to as an outer fifth floating structure. In addition, a left fifth floating structure 165L closer to the center of the lower surface of the first redistribution structure 100 may be referred to as an inner fifth floating structure. This naming method may also be applied to a seventh floating structure 167 to a ninth floating structure 169 to be described below, and the description already given thereto is omitted.

As shown in FIG. 6, on the lower surface of the first redistribution structure 100, the right fourth floating structure 164R disposed between the first passive element 150A and the second passive element 150B may have a greater width in the second horizontal direction (Y-axis direction) than the left fourth floating structure 164L. Similarly, the left fifth floating structure 165L disposed between the first passive element 150A and the second passive element 150B may have a greater width in the second horizontal direction (Y-axis direction) than the right fifth floating structure 164R.

In the semiconductor package 1D, according to one or more embodiments, the floating structure disposed between the first passive element 150A and the second passive element 150B may have a greater volume than floating structures not disposed between the first passive element 150A and the second passive element 150B, so as to prevent or reduce defects in the external connection terminal 140 provided between the first non-connection terminal area NB1 and the second non-connection terminal area NB2. Thermal expansion due to temperature rise generated in the underfill layer in the first and second non-connection terminal areas NB1 and NB2 may be reduced through the floating structure having a greater volume.

Accordingly, through the semiconductor package 1D, according to one or more embodiments, reliability of the semiconductor package ID may be improved by preventing or reducing defects that may occur in the external connection terminal 140 provided between the first and second non-connection terminal areas NB1 and NB2.

Figure 7:
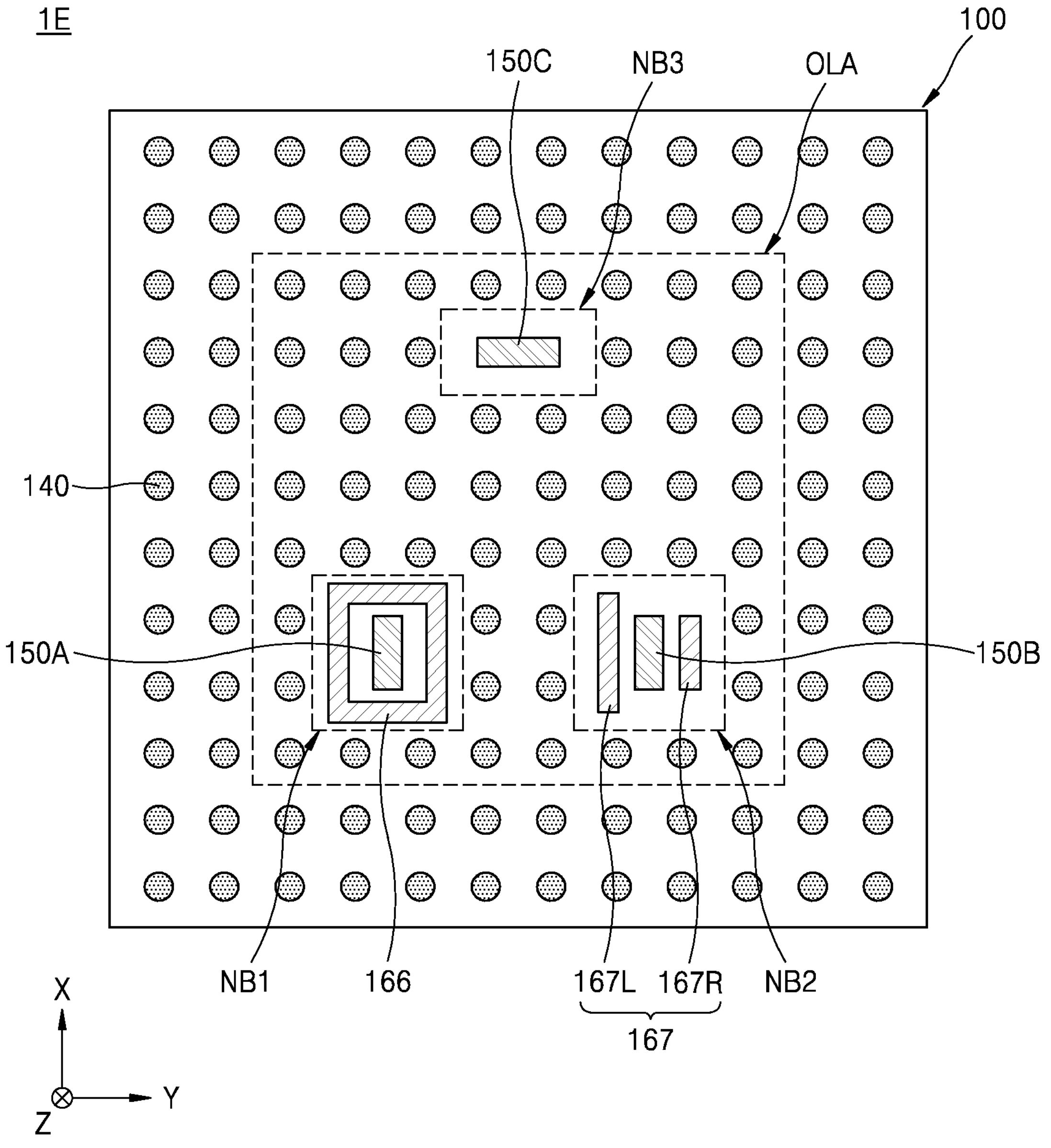
FIG. 7 is a plan view illustrating a semiconductor package according to one or more embodiments.

FIG. 7 is a plan view illustrating a semiconductor package 1E according to one or more embodiments.

Referring to FIG. 7, a floating structure surrounding the periphery of a passive element 150 may be provided. For example, as in FIG. 7, a sixth floating structure 166 surrounding a first passive element 150A may be provided on the lower surface of a first redistribution structure 100. On the X-Y plane, which is the lower surface of the first redistribution structure 100, the sixth floating structure 166 may have a frame-like shape in which the first passive element 150A is disposed in the center so that the floating structure may be positioned between external connection terminals 140 disposed around the first passive element 150A.

The sixth floating structure 166 in the semiconductor package 1E, according to one or more embodiments, may significantly and advantageously reduce the volume of an underfill layer interposed in the first non-connection terminal area NB1. Accordingly, reliability of the semiconductor package 1E may be improved by preventing or reducing defects that may occur in the external connection terminal 140 through the semiconductor package 1E according to one or more embodiments.

In one or more examples, for a seventh floating structure 167 including a left seventh floating structure 167L and a right seventh floating structure 167R, the length of the left seventh floating structure 167L may be different from that of the right seventh floating structure 167R.

Figure 8:
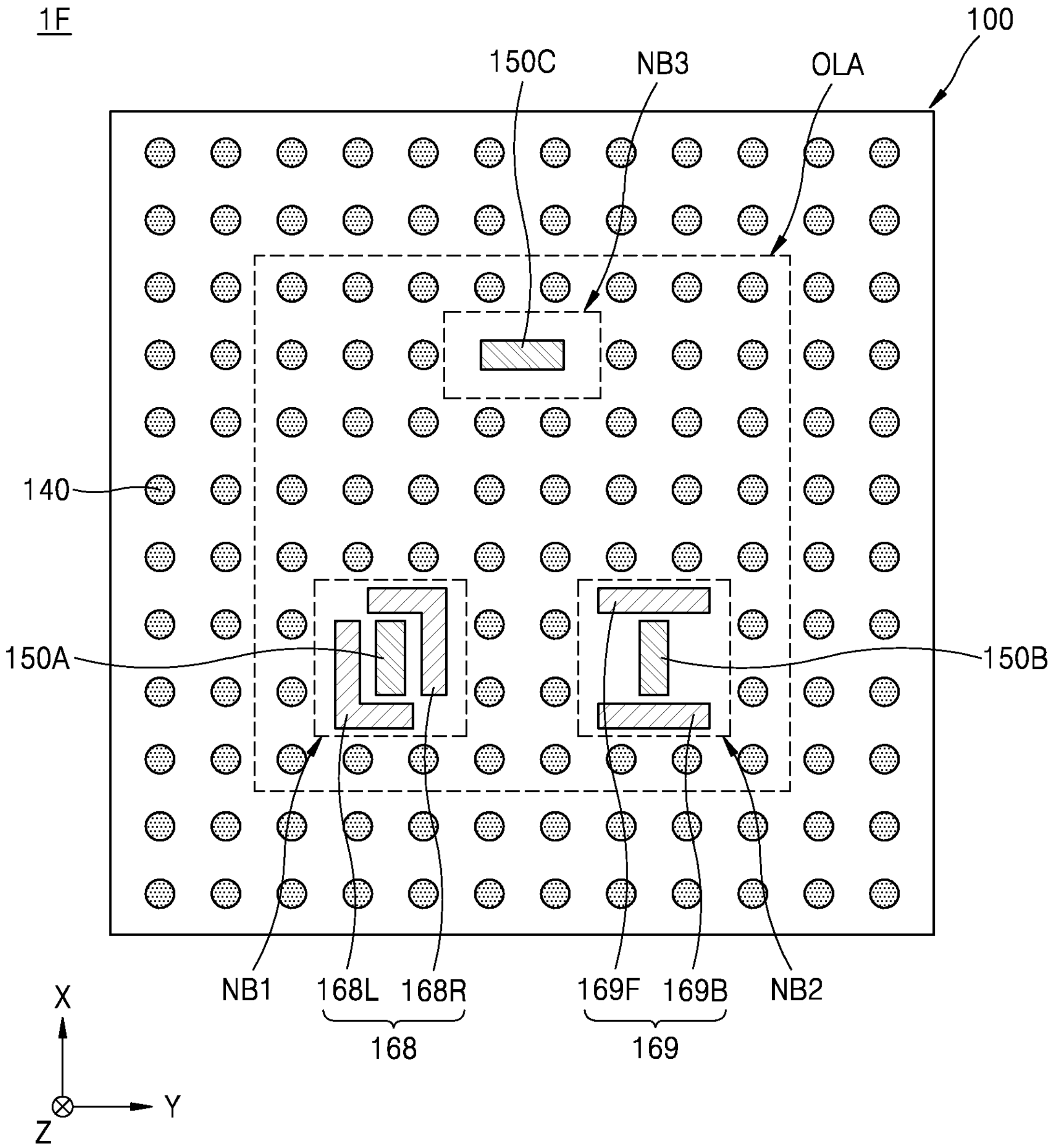
FIG. 8 is a plan view illustrating a semiconductor package according to one or more embodiments.

FIG. 8 is a plan view illustrating a semiconductor package 1F according to one or more embodiments.

Referring to FIG. 8, like the sixth floating structure 166 having the frame-like shape described above around the passive element 150, a floating structure surrounding the passive element 150 and divided into two may be provided. For example, as shown in FIG. 8, an 'L-shaped' floating structure may be symmetrically disposed around the first passive element 150A, and an eighth floating structure 158 may be provided to surround the circumference of the first passive element 150A.

In one or more examples, the first, second, third, fourth, and seventh floating structures 161,162,163,164, and 167, respectively, the floating structure may be disposed in an orientation that is not parallel to the passive element 150. For example, as shown in FIG. 8, a ninth floating structure 169 including a front ninth floating structure 169F and a rear ninth floating structure 169B may be disposed in an orientation that is not parallel to the second passive element 150B. A longitudinal direction of the second passive element 150B may be the first horizontal direction (X-axis direction), and a longitudinal direction of the ninth floating structure 169 disposed in the second non-connection terminal area NB2 where the second passive element 150B is located may be a second horizontal direction (Y-axis direction).

Figure 9:
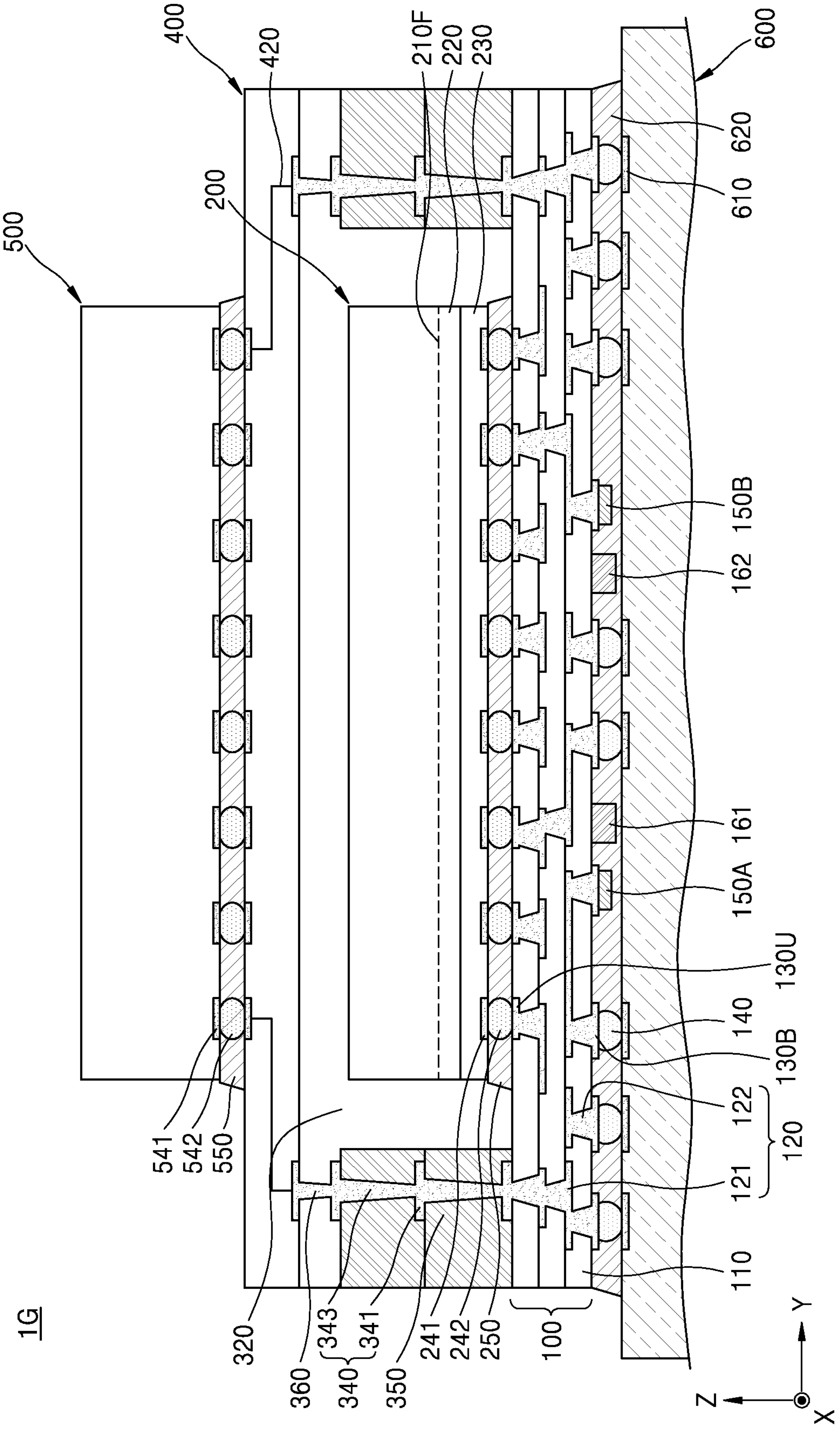
FIG. 9 is a cross-sectional view illustrating a semiconductor package according to one or more embodiments.

FIG. 9 is a cross-sectional view illustrating a semiconductor package 1G according to one or more embodiments The description already given of the embodiments of the present disclosure may be omitted.

Referring to FIG. 9, the semiconductor package 1G according to the embodiment may be a panel level package (PLP). In more detail, the semiconductor package 1G according to one or more embodiments may be a fan-out panel level package (FOPLP).

A substrate base 350 may be positioned on a portion of the upper surface of a first redistribution structure 100. The substrate base 350 may be formed of an insulating material. For example, the substrate base 350 may include at least one material selected from flame retardant 4 (FR-4), tetrafunctional epoxy, polyphenylene ether, epoxy/polyphenylene oxide, bismaleimide triazine (BT), thermount, cyanate ester, phenolic resin, epoxy resin, polyimide, and liquid crystal polymer.

In one or more examples, a conductive connection structure 340 extending through the substrate base 350 from the lower surface to the upper surface of the substrate base 350 may be included. The conductive connection structure 340 may be electrically connected to a lower redistribution pattern 120 of the lower redistribution structure 100. The conductive connection structure 340 may be electrically connected to a chip pad 223 of the internal semiconductor device 200 and/or an external connection terminal 290 through the lower redistribution pattern 120. The conductive connection structure 340 may include a plurality of conductive layers 341 extending in a horizontal direction (e.g., an X direction and/or a Y direction) and a plurality of conductive via patterns 343 extending in a vertical direction (e.g., a Z direction). The conductive connection structure 340 may be made of copper, nickel, stainless steel, or beryllium copper.

The plurality of conductive layers 341 may be arranged spaced apart from each other at different vertical levels within the substrate base 350. The plurality of conductive layers 341 may extend on at least one of upper and lower surfaces of each of the plurality of layers constituting the substrate base 350. The plurality of conductive via patterns 343 may pass through at least a portion of the substrate base 350 and extend in a vertical direction (e.g., a Z direction), and may electrically connect the plurality of conductive layers 341 positioned at different vertical levels.

The semiconductor package 1G may include the second redistribution structure 400 disposed on the encapsulant 320. Among the descriptions of the second redistribution structure 400, a description already given in the first redistribution structure 100 may be omitted. A plurality of upper redistribution via patterns 360 extend downward from the upper surface and may extend through the encapsulant 320. In some embodiments, each of the plurality of upper redistribution via patterns 360 may have a tapered shape in which a horizontal width narrows and extends in a direction from an upper side to a lower side thereof. At least one of the plurality of upper redistribution via patterns 360 may be connected to the conductive connection structure 340. The upper redistribution pattern 243 may be electrically connected to the lower redistribution pattern 120 through the conductive connection structure 340.

Figure 10:
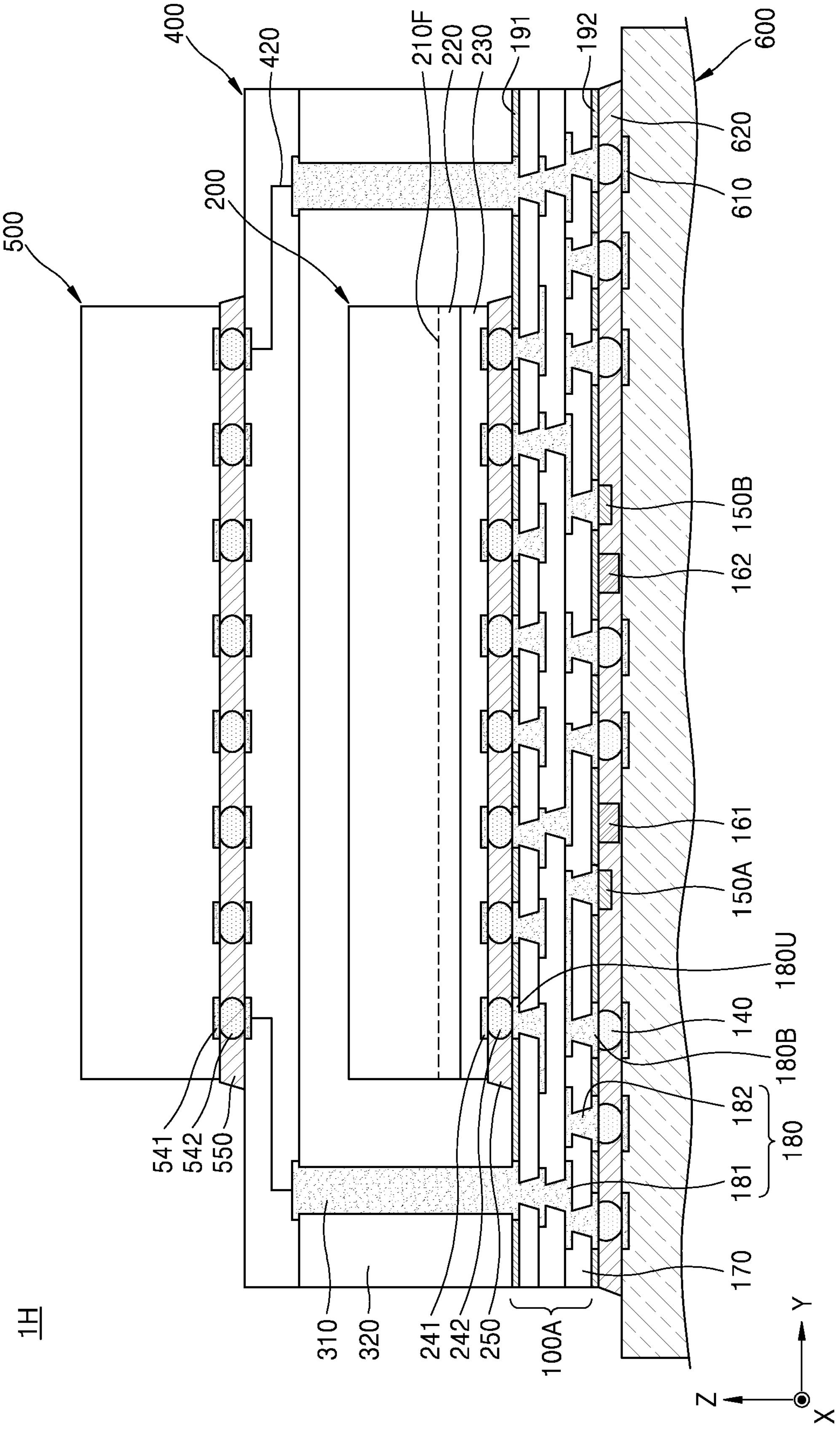
FIG. 10 is a cross-sectional view illustrating a semiconductor package according to one or more embodiments.

FIG. 10 is a cross-sectional view illustrating a semiconductor package 1H according to one or more embodiments.

The description already given of the embodiments of the present disclosure may be omitted.

The semiconductor package 1H according to one or more embodiments may include a printed circuit board as a first package substrate 100A. The first package substrate 100A may include insulating layers 170, a top passivation layer 191, and a bottom passivation layer 192, and a wiring structure 180. A case in which the first package substrate 100A of the semiconductor package 1H according to the embodiment has a multilayer structure including insulating layers 170 is described as an example. However, the embodiments are not limited to this configuration, and the first package substrate 100A may have a single-layer structure. The wiring structure 180 may include wiring patterns 181 and connection vias 182. The first package substrate 100A may be a support substrate for manufacturing a semiconductor package by mounting a semiconductor chip thereon. Lower surface pad patterns 180B may be disposed on the first package substrate 100A.

The insulating layers 170 may include a plurality of insulating layers stacked in a vertical direction Z, for example, three insulating layers including a first insulating layer, a second insulating layer, and a third insulating layer. The insulating layers 170 may cover the wiring patterns 181 and the connection vias 182. The insulating layers 170 may include an insulating resin. The insulating resin may include a thermosetting resin such as an epoxy resin, a thermoplastic resin such as polyimide, or a resin impregnated with inorganic fillers or/and glass fiber (glass cloth or glass fabric) in these resins, for example, prepreg, ajinomoto build-up film (ABF), FR-4, and bismaleimide triazine (BT). The insulating layers 170 may include a photosensitive resin, such as photoimageable dielectric (PID) resin. In this case, the insulating layers 170 may be formed thinner, and the wiring patterns 181 and the connection vias 182 may be formed more minutely. Depending on the process, the boundary between the insulating layers 170 of different levels may be unclear.

The top passivation layer 191 and the bottom passivation layer 192 may be provided as layers to protect the semiconductor package from external physical or chemical damage. The top passivation layer 191 and the bottom passivation layer 192 may protect the first package substrate 100A. The bottom passivation layer 192 may be disposed to cover, for example, bottom surface of lowermost layer of the plurality of insulating layers 170 in a lower region of the first package substrate 100A. The top passivation layer 191 may be disposed to cover the top surface of the uppermost layer of the plurality of insulating layers 170. The top passivation layer 191 and the bottom passivation layer 192 may include an insulating resin and an inorganic filler, but may not include glass fibers. For example, the top passivation layer 191 and the bottom passivation layer 192 may include ABF, but are not limited thereto, and may include a photosensitive insulating material (PID) or insulating polymer, for example, photosensitive polyimide (PSPI).

An opening may be formed in a portion of the bottom passivation layer 192 to expose at least a portion of the lower surface pad patterns 180B, respectively. A plurality of external connection terminals 140 such as solder balls may be respectively connected to the lower surface pad patterns 180B exposed through the opening. The lower surface pad patterns 180B may include, for example, copper (Cu), aluminum (Al), silver (Ag), tin (Sn), gold (Au), nickel (Ni), lead (Pb), titanium (Ti), or a metal material including an alloy thereof. Similar to the lower surface pad patterns 180B, an opening may be formed in a portion of the top passivation layer 191 to expose at least a portion of an upper surface pad patterns 180U.

While the embodiments of the present disclosure have been particularly shown and described with reference to embodiments thereof, it will be understood that various changes in form and details may be made therein without departing from the spirit and scope of the following claims.

What is claimed is:

1. A semiconductor package comprising:

a first package substrate;

a semiconductor device mounted on a first surface of the first package substrate and electrically connected to the first package substrate;

a plurality of connection pads on a second surface of the first package substrate;

a plurality of external connection terminals respectively disposed on one or more connection pads of the plurality of connection pads;

a plurality of passive elements mounted on one or more connection pads of the plurality of connection pads in which the plurality of external connection terminals are not disposed; and a floating structure disposed between at least one passive element from the plurality of passive elements and at least one external connection terminal from the plurality of external connection terminals, spaced apart from the at least one passive element and the at least one external connection terminal, and disposed on the second surface of the first package substrate, wherein the floating structure is insulated.

2. The semiconductor package of claim 1, further comprising:

an external substrate on which the first package substrate is mounted and electrically connected to the at least one external connection terminal; and an underfill layer provided between the external substrate and the first package substrate, wherein the at least one passive element comprises a shape extending in one direction on the second surface of the first package substrate, wherein a longitudinal direction of the at least one passive element, which is an extension direction of the extended shape of the at least one passive element, is parallel to a first horizontal direction parallel to the second surface of the first package substrate, wherein the floating structure comprises a shape extending in one direction on the second surface of the first package substrate, and wherein the floating structure is disposed apart from the at least one passive element in a second horizontal direction parallel to the second surface of the first package substrate and perpendicular to the first horizontal direction.

3. The semiconductor package of claim 2, wherein a longitudinal direction of the floating structure, which is an extension direction of the extended shape of the floating structure, is parallel to the first horizontal direction, and wherein a length of the floating structure in the extension direction of the extended shape of the floating structure is greater than or equal to a length of the at least one passive element in the extension direction of the extended shape of the at least one passive element.

4. The semiconductor package of claim 1, wherein the floating structure is a first floating structure, and the at least one passive element is a first passive element, and wherein the semiconductor package further comprises:

a second passive element from the plurality of passive elements spaced apart from the first passive element, with the at least one external connection terminal being provided between the first passive element and the second passive element; and a second floating structure disposed between the second passive element and the at least one external connection terminal, apart from the second passive element and the at least one external connection terminal, and disposed on the second surface of the first package substrate.

5. The semiconductor package of claim 4, wherein the first floating structure and the second floating structure are disposed between the first passive element and the second passive element.

6. The semiconductor package of claim 5, wherein the second passive element comprises a shape extending in one direction on the second surface of the first package substrate, wherein a longitudinal direction of the second passive element, which is an extension direction of the extended shape of the second passive element, is parallel to a first horizontal direction parallel to the second surface of the first package substrate, wherein the first floating structure comprises a shape extending in one direction on the second surface of the first package substrate, the second floating structure comprises a shape extending in one direction on the second surface of the first package substrate, and wherein a longitudinal direction of the first floating structure, which is an extension direction of the extended shape of the first floating structure, is parallel to the first horizontal direction, and a longitudinal direction of the second floating structure, which is an extension direction of the extended shape of the second floating structure, is parallel to the first horizontal direction.

7. The semiconductor package of claim 1, wherein the floating structure comprises an inner floating structure and an outer floating structure, wherein the inner floating structure is provided between the at least one passive element and the at least one external connection terminal, on the second surface of the first package substrate, and the outer floating structure is provided on the opposite side of a direction in which the inner floating structure is provided, based on the at least one passive element.

8. The semiconductor package of claim 1, further comprising:

an external substrate on which the first package substrate is mounted and electrically connected to at least one external connection terminal from the plurality of external connection terminals; and an underfill layer provided between the external substrate and the first package substrate, wherein the floating structure is provided between the first package substrate and the external substrate, in an overlapping area overlapping a shape of the semiconductor device in a vertical direction, and wherein the vertical direction is a direction perpendicular to the first surface and the second surface of the first package substrate.

9. The semiconductor package of claim 1, wherein the floating structure comprises a ring shape surrounding the at least one passive element on the second surface of the first package substrate to be disposed between the at least one passive element and the at least one external connection terminal.

10. The semiconductor package of claim 1, wherein the floating structure is attached to the first package substrate via an adhesive layer provided on the first package substrate.

11. The semiconductor package of claim 1, wherein the floating structure is mounted on the second surface of the first package substrate as a floating connection terminal to a dummy pad provided on the second surface of the first package substrate.

12. The semiconductor package of claim 1, further comprising:

an external substrate on which the first package substrate is mounted and electrically connected to at least one external connection terminal from the plurality of external connection terminals; and an underfill layer provided between the external substrate and the first package substrate, wherein a first height, which is a distance vertically from a surface of the external substrate to the second surface of the first package substrate, is greater than a second height, which is a vertical level of at least one passive element of the plurality of passive elements from the second surface of the first package substrate, wherein the second height is less than a third height that is a vertical level of the floating structure from the second surface of the first package substrate, and wherein the first height is greater than the third height.

13. The semiconductor package of claim 1, wherein a first distance, which is a distance at which at least one passive element from the plurality of passive elements and the floating structure are horizontally spaced apart from each other, is 50 μm or more.

14. The semiconductor package of claim 1, wherein the floating structure is made of a material including silicon or polymer.

15. The semiconductor package of claim 1, wherein the semiconductor device is a first semiconductor device, the semiconductor package further comprising:

an encapsulant surrounding the semiconductor device on the first surface of the first package substrate;

a second package substrate disposed on the encapsulant;

a conductive post penetrating the encapsulant and electrically connecting the second package substrate and the first package substrate to each other; and a second semiconductor device mounted on a surface of the second package substrate.

16. The semiconductor package of claim 15, wherein the first semiconductor device comprises an application processor (AP), and the second semiconductor device comprises a memory device.

17. A semiconductor package comprising:

a first redistribution structure;

a semiconductor device mounted on a first surface of the first redistribution structure and electrically connected to the first redistribution structure;

a plurality of connection pads on a second surface of the first redistribution structure;

a plurality of external connection terminals respectively disposed on at least one or more connection pads of the plurality of connection pads;

a plurality of passive elements mounted on one or more connection pads of the plurality of connection pads in which the plurality of external connection terminals are not disposed;

an external substrate on which the first redistribution structure is mounted, and being electrically connected to at least one external connection terminal from the plurality of external connection terminals;

a floating structure provided on the second surface of the first redistribution structure in a non-connection terminal area; and an underfill layer provided between the external substrate and the first redistribution structure, wherein the floating structure is insulated, and wherein the non-connection terminal area is defined as an area between the external substrate and the first redistribution structure where the plurality of external connection terminals are not disposed and the plurality of passive elements are included.

18. The semiconductor package of claim 17, wherein the floating structure is a first floating structure, at least one passive element from the plurality of passive elements is a first passive element, the non-connection terminal area is a first non-connection terminal area, and wherein the semiconductor package further comprises:

a second passive element from the plurality of passive elements spaced apart from the first passive element and provided with at least one external connection terminal from the plurality of external connection terminals between the first passive element and the second passive element; and a second floating structure provided on the second surface of the first redistribution structure in a second non-connection terminal area, wherein the second floating structure is spaced apart from the second passive element and the at least one external connection terminal, respectively, and the first floating structure and the second floating structure are disposed between the first passive element and the second passive element, and wherein the second non-connection terminal area is defined as an area between the external substrate and the first redistribution structure, where the plurality of external connection terminals are not disposed, and comprises the second passive element.

19. The semiconductor package of claim 17, wherein the semiconductor device is a first semiconductor device, the semiconductor package further comprising:

an encapsulant surrounding the first semiconductor device, on the first surface of the first redistribution structure;

a second redistribution structure disposed on the encapsulant;

a conductive post penetrating the encapsulant and electrically connecting the second redistribution structure and the first redistribution structure to each other; and a second semiconductor device mounted on a surface of the second redistribution structure, wherein the first semiconductor device comprises an application processor (AP), wherein the second semiconductor device comprises a memory device, wherein the floating structure is provided in an overlapping area overlapping a shape of the first semiconductor device in a vertical direction, between the first redistribution structure and the external substrate, and wherein the vertical direction is a direction perpendicular to the first and second surfaces of the first redistribution structure.

20. A semiconductor package comprising:

a first redistribution structure;

a first semiconductor device mounted on a first surface of the first redistribution structure, electrically connected to the first redistribution structure, and including an application processor (AP);

a plurality of connection pads on a second surface of the first redistribution structure;

a plurality of external connection terminals respectively disposed on one or more connection pads of the plurality of connection pads;

a plurality of passive elements mounted on one or more connection pads of the plurality of connection pads in which the plurality of external connection terminals are not disposed;

a floating structure disposed between at least one passive element from the plurality of passive elements and at least one external connection terminal from the plurality of external connection terminals, spaced apart from the at least one passive element and the at least one external connection terminal, and disposed on a second surface of the first redistribution structure;

an external substrate on which the first redistribution structure is mounted and electrically connected to the external connection terminal;

an underfill layer provided between the external substrate and the first redistribution structure;

an encapsulant surrounding the first semiconductor device, on the first surface of the first redistribution structure;

a second redistribution structure disposed on the encapsulant;

a conductive post penetrating the encapsulant and electrically connecting the second redistribution structure and the first redistribution structure to each other; and a second semiconductor device mounted on a surface of the second redistribution structure and including a memory device, wherein the floating structure is insulated, wherein an adhesive layer is interposed between the floating structure and the second surface of the first redistribution structure so that the floating structure is attached by the adhesive layer, wherein the floating structure is between the first redistribution structure and the external substrate, in an overlapping region overlapping a shape of the first semiconductor device in a vertical direction, and the vertical direction is a direction perpendicular to the first and second surfaces of the first redistribution structure, and wherein the floating structure is made of a material including silicon or polymer.

* * * * *